United States Patent
Zeng et al.

(10) Patent No.: US 12,138,683 B2
(45) Date of Patent: Nov. 12, 2024

(54) SUBSTRATE-TRIGGERED DIRECTIONAL SOLIDIFICATION PROCESS FOR SINGLE CRYSTAL SUPERALLOY

(71) Applicant: Shanghai Jiaotong University, Shanghai (CN)

(72) Inventors: Long Zeng, Shanghai (CN); Mingxu Xia, Shanghai (CN); Jun Li, Shanghai (CN); Binqiang Wang, Shanghai (CN); Jianguo Li, Shanghai (CN)

(73) Assignee: Shanghai Jiaotong University, Shanghai (CN)

( * ) Notice: Subject to any disclaimer, the term of this patent is extended or adjusted under 35 U.S.C. 154(b) by 176 days.

(21) Appl. No.: 17/773,051

(22) PCT Filed: Dec. 9, 2020

(86) PCT No.: PCT/CN2020/134913
§ 371 (c)(1),
(2) Date: Apr. 29, 2022

(87) PCT Pub. No.: WO2021/196713
PCT Pub. Date: Oct. 7, 2021

(65) Prior Publication Data
US 2022/0395897 A1 Dec. 15, 2022

(30) Foreign Application Priority Data
Mar. 30, 2020 (CN) .......................... 202010234442.8

(51) Int. Cl.
B22D 27/04 (2006.01)
C22C 19/05 (2006.01)
(Continued)

(52) U.S. Cl.
CPC .......... B22D 27/045 (2013.01); C22C 19/057 (2013.01); C30B 11/02 (2013.01); C30B 11/14 (2013.01); C30B 29/52 (2013.01)

(58) Field of Classification Search
CPC ....................................................... B22D 27/045
See application file for complete search history.

(56) References Cited

U.S. PATENT DOCUMENTS 4,353,405 A * 10/1982 Kolakowski ............ C30B 11/14
164/122.2
4,714,101 A   12/1987 Terkelsen
6,497,272 B1 * 12/2002 Maslen ................. C30B 11/002
164/122.2

FOREIGN PATENT DOCUMENTS

CA       1142839      3/1983
CN     105839186      8/2016
(Continued)

OTHER PUBLICATIONS

"International Search Report (Form PCT/ISA/210) of PCT/CN2020/134913", mailed on Feb. 25, 2021, with English translation thereof, pp. 1-5.
(Continued)

*Primary Examiner* — Kevin P Kerns
*Assistant Examiner* — Steven S Ha
(74) *Attorney, Agent, or Firm* — JCIPRNET

(57) ABSTRACT

The present invention relates to a substrate-triggered single crystal superalloy directional solidification process, including: (1) preparing a single crystal substrate material having crystallographic characteristics that match crystallographic characteristics of the single crystal superalloy; (2) fabricating a single crystal substrate chilling plate using the obtained single crystal substrate material; and (3) applying the obtained single crystal substrate chilling plate in a directional solidification apparatus, and then preparing a single
(Continued)

crystal alloy product by performing superalloy melting and directional solidification. Compared with grain selector method and seeding with grain selector method, in addition to control the crystallographic orientation of the single crystal superalloy precisely, the present invention could reduce the height of block and the whole mold through canceling the spiral grain selector, significantly improve the axial heat dissipation and temperature gradient at the solid-liquid interface, and then reduce the occurrence of freckles and stray grains near platform.

7 Claims, 2 Drawing Sheets

(51) Int. Cl.
*C30B 11/02* (2006.01)
*C30B 11/14* (2006.01)
*C30B 29/52* (2006.01)

(56) References Cited

FOREIGN PATENT DOCUMENTS

| | | |
|---|---|---|
| CN | 107747120 | 3/2018 |
| CN | 108080603 | 5/2018 |
| CN | 108624959 | 10/2018 |
| CN | 109082710 | 12/2018 |
| CN | 111364096 | 7/2020 |

OTHER PUBLICATIONS

"Written Opinion of the International Searching Authority (Form PCT/ISA/237) of PCT/CN2020/134913", mailed on Feb. 25, 2021, pp. 1-4.

Willem Jan Huisman et al., "Layering of a liquidmetal in contact with a hardwall", Nature, vol. 390, Nov. 1997, pp. 379-381.

L. Wang et al., "The Role of Lattice Misfit on Heterogeneous Nucleation of Pure Aluminum", Metallurgical and Materials Transactions A, vol. 47A, Oct. 2016, pp. 5012-5022.

S. H. Oh et al., "Ordered Liquid Aluminum at the Interface with Sapphire", Science, vol. 310, Oct. 2005, pp. 661-663.

\* cited by examiner

SUBSTRATE-TRIGGERED DIRECTIONAL SOLIDIFICATION PROCESS FOR SINGLE CRYSTAL SUPERALLOY

CROSS-REFERENCE TO RELATED APPLICATION

This application is a 371 of international application of PCT application serial no. PCT/CN2020/134913, filed on Dec. 9, 2020, which claims the priority benefit of China application no. 202010234442.8, filed on Mar. 30, 2020. The entirety of each of the above mentioned patent applications is hereby incorporated by reference herein and made a part of this specification.

FIELD OF TECHNOLOGY

The present invention belongs to the field of single crystal superalloy preparation, and particularly relates to a substrate-triggered directional solidification process for single crystal superalloy.

BACKGROUND

Nowadays, almost all high pressure compressor turbine blades for advanced aero-engines are prepared by directional solidification, as the elimination of potential crack initiation points and the increase of high-temperature deformation ability cause by disappearing of crystal boundary. The common directional solidification processes include: high rate solidification (HRS), liquid melt cooling (LMC), and gas cooling casting (GCC). LMC and GCC processes are the optimizations of the HRS method, which have greatly enhanced the temperature gradient and cooling rate at the frontier of the solid-liquid interface through instead of heat dissipation in vacuum by liquid metal and gas respectively. However, HRS process is still prevalent in the field of directional solidification for the single crystal turbine blades owing to its simple apparatus and convenient operation.

Two different techniques, grain selector or seeding, are frequently used for the manufacture of single crystal superalloys. During grain selector process, as shown in 1(a), free-oriented crystals are formed on the surface of chilling plate once molten alloy is poured into the mold. Then the crystals transform into columnar crystals under unidirectional heat flow, and crystals with unfavorable crystallographic or orientation are eliminated through competitive growth. Finally, a single crystal with an orientation close to <001> is obtained and fulfills the whole casting mold. Research show that the deviation of the single crystal blade could be successfully controlled within the scope of 15° through optimizing the parameters of the spiral grain selector during grain selection. Obviously, it cannot meet the production of high-performance single crystal turbine blade for which the deviation angle is required less than 8°.

During the preparation of single crystal blade by seeding technique, a seed with specific orientation is firstly assembled in the mold casing, and then heated together with the mold till the top of the seed is partially melted. After the molten alloy is introduced into the mold casing, they are withdrew from heating furnace at a fixed speed. The dendrites on the top of the seed crystal begin to propagate until the whole mold is filled under unidirectional heat flow. Compared with grain selector method, the biggest advantage of seeding process is that it could control the crystallographic of the new crystal accurately and obtain single crystal with unfavorable orientation. However, nucleation of highly mis-oriented stray grains is always observed at the outside of seed melt-back region, which is caused by the constitutional undercooling due to the solid-liquid interface vibration or the dendrite re-melt. The stray grain could propagate along the heat diffusion direction and seriously affect the quality of the single crystal blade.

In order to eliminate stray grains near the seed melt-back region, a seeding method combined with grain selector is mainly used during the preparation of single crystal superalloy blade in scientific research and industrial production, as shown in FIG. 1(b). However, this method owns low production efficiency and high production cost due to the complexity of seed preparation and assemble. To solve this problem, the patent numbered CN 105839186A discloses a novel method named seed reused method. The melt-back zone is eliminated by weakening the liquid metal flushing speed on the seed through reducing the surface roughness of the inner wall of the mold and increasing the assembly accuracy between seed and the inner wall. The patent numbered CN 108624959A discloses a method for preparing single crystal superalloys using a seed after solution treatment. The microstructure of the seed transfers from coarse dendritic structure to a uniform complicated network-like structure after solution. And this could enhance the deformation resistance of the un-melted zoom and prevent the formation of stray grains. Although the method prevents the stray grains in seed melt-back region to a certain extent, the procedure is still complicated as preparation and assemble of seed still cannot be avoided.

In recent years, researchers work on the nucleation of molten metal and solidification process have found that the orientation of the substrate has a profound influence on the structure of liquid atoms and the final crystal. In the article (Nature, 1997, 390: 379-381), the melt structure of liquid Ga on a diamond with (111) plane was characterized indirectly through X-ray diffraction for the first time. It was found that the interlayer spacing of the molten metal near the substrate was equal to that of (001) plane for Ga solid, which indicated the liquid presented a solid-like structure. In the article (Sci. 2005, 310: 661-663), the melt structure of Al on $Al_2O_3$ substrate with (0001) crystal plane was observed directly through an in-situ high-temperature transmission electron microscope for the first time. It was confirmed that the liquid Al adjacent to the substrate presented ordered structure like solid Al. The inventors has systematically studied the solidification processes of Al melt on different crystal planes of $Al_2O_3$, i.e. $(22\bar{4}3)$, $(10\bar{1}0)$, $(1\bar{1}02)$, $(10\bar{1}1)$, $(10\bar{1}4)$, $(0001)$, $(11\bar{2}3)$, $(31\bar{4}2)$, and $(11\bar{2}0)$, and then characterize the interface and the solidified structure. The results show that the Al melt structure adjacent to the single crystal substrate presents the ordered solid-like structure, and the solidified microstructure also presents ordered crystal structure which is directly affect by the crystallographic orientation of the single crystal substrates (Metal. Mater. Trans. A, 2016, 47: 5012-5022).

SUMMARY

Based on the above, the present invention provides a substrate-triggered directional solidification process for single crystal superalloy, including: selecting a single crystal material for the substrate which crystallographic characteristics matches the single crystal superalloy well, triggering the nucleation of melt and the growth of newly dendrites on the substrate, and then obtaining the single crystal alloy with an expected crystallographic orientation.

The objective of the present invention is achieved through the following technical solutions:

A substrate-triggered directional solidification process for single crystal superalloy includes:

(1) Preparing a single crystal substrate material having crystallographic characteristics that match crystallographic characteristics of the single crystal superalloy;

(2) Fabricating a single crystal substrate chilling plate using the obtained single crystal material; and (3) applying the obtained single crystal substrate chilling plate in a directional solidification furnace, and then preparing a single crystal superalloy product by performing melting and directional solidification.

Further, the crystallographic characteristics of the single crystal substrate and the single crystal superalloy in step (1) satisfy the following relation: the lattice mismatching degree between a crystal plane of the single crystal substrate and a crystal plane of the single crystal superalloy is less than or equal to 7.8%. Otherwise, crystallographic defects, such as stacking faults and strain, are prone to be introduced during triggered nucleation of directional solidification, which could lead to stray grains at the beginning of directional solidification or in subsequent heat treatment.

Further, a low-index crystal plane is selected as the crystal plane of the single crystal substrate material that directly contacts with the superalloy melt. The low-index crystal plane indicates generally a close-packed plane of atomic stacks, which owns high interface stability in high-temperature environment.

Further, the single crystal substrate material in step (1) is prepared through grain selection directional solidification process and the related casting parameters is mainly depend on the thermophysical properties of the substrate material. The crystallographic orientation of the single crystal substrate material is detected by using the following method:

ensuring the macrostructure of the single crystal substrate material is free of stray grains by using sand blasting treatment and macrostructure etching treatment;

performing an orientation test on the qualified single crystal substrate material by Laue diffraction.

cutting the single crystal substrate material by using wire-cutting based on the test result of the Laue Diffractometer to obtain the single crystal substrate material with the expected crystal plane.

Further, the shape of the single crystal substrate casting during direction solidification is preferably cylinder.

Further, the single crystal substrate chilling plate in step (2) may preferably be made of the single crystal substrate material, and can also be assembled of the single crystal substrate material and pure copper.

The assembled single crystal substrate chilling plate, which is consist of key structure and main structure, owns great advantage especially when the fabrication of large scale single crystal substrate material is difficult. The key structure, which refers to the area in direct contact with the block of the mold, is made of single crystal substrate material. The diameter of the key structure is greater than that of the block and the height is 3 mm to 20 mm. The main structure which refers to the other area is made of pure copper. The single crystal substrate material for the key structure and the pure copper for the main structure are preferably connected through soldering, and an assemble accuracy between them should be thought.

Further, an inner portion of the single crystal substrate chilling plate is disposed with a water-cooling channel with a ring shape, and an outer portion of the single crystal substrate chilling plate is disposed with threads to connect with a pulling rod of the directional solidification apparatus.

Further, in step (3), the melting temperature of the superalloys is 1450-1600° C. and the pouring speed of the melt molten is 3-10°/s. The heating temperature for the upper furnace and the lower furnace are 1500-1600° C. and 1450-1550° C., respectively. The pulling rate during directional solidification is 20 μm/s-100 μm/s.

Further, detect the macrostructure and microstructure of the obtained single crystal alloy casting.

Further, the macroscopic structure detection comprises surface sand blasting and macrostructure etching, the blasting time is 5 min-10 min, and a etchant depends on the type of the superalloy.

Compared with the prior methods, the present invention has the advantages and beneficial effects:

(1) Compared with grain selection method, the crystallographic orientation of the single crystal superalloy is precisely controlled and the defect of large orientation deviation angle is completely eliminated.

(2) Compared with the method combined of seeding and grain selection, the substrate-triggered method could improve production efficiency obviously as seed preparation and assemble is omitted.

(3) Compared with traditional methods, the substrate-triggered directional solidification could reduce the height of block and the whole mold through canceling the spiral grain selector, which could shorten the distance between the blade and the chilling plate and then significantly improve the axial heat dissipation and temperature gradient at the solid-liquid interface. This could reduce the occurrence of freckles and stray grains near platform and improve the qualification rate for single crystal.

DESCRIPTION OF THE EMBODIMENTS

The present invention is described in detail below with reference to the accompanying drawings and the specific embodiments.

EMBODIMENT

In the present embodiment, DD5 superalloy is used to prepare a certain type of single crystal turbine blade, which is mainly made of the following alloy elements: C (0.040-0.060), Cr (6.75-7.25), Co (7.00-8.00), W (4.75-5.25), Al (6.00-6.40), Ta (6.30-6.70), Mo (1.30-1.70), Hf (0.12-0.18), B (0.003-0.005), Re (2.75-3.25), and the balance nickel.

The present embodiment particularly includes:

(1) Prepare single crystal materials for substrate which owns similar crystallographic characteristics as that of DD5 single crystal superalloy.

In the present embodiment, DD5 superalloy is selected as the single crystal substrate material: (a) Since both the single crystal superalloy and the single crystal substrate material use the alloy DD5, lattices of which perfectly match each other, so as to satisfy that a lattice mismatching degree is smaller than or equal to 7.8%. (b) A crystal face, in contact with a superalloy melt, of the DD5 single crystal substrate material is (001), which is a low-index crystal face of a face-centered cubic crystal and has high interface stability in a high-temperature environment.

The DD5 single crystal substrate material is prepared through grain selection directional solidification process. The main casting parameters are as follows: the melting temperature is 1480-1550° C. and the pouring speed of the melt molten is 5°/s; the heating temperature for the upper furnace and the lower furnace are 1500-1550° C. and 1450-1500° C., respectively; and the pulling rate during directional solidification is 20 μm/s-50 μm/s. The casting mold for DD5 superalloy is cylindrical. The single crystal bar is subjected to sand blowing and macroscopic etching, and is free of stray grains on macrostructure. Then, the orientation of the single crystal bar is tested by Lauer Diffraction. Finally, the DD5 single crystal bar is wire-cut based on the result of the Laue Diffractometer and a single crystal substrate material with (001) crystal plane is gotten.

(2) Fabricate a single crystal substrate chilling plate using the obtained DD5 single crystal material.

Figure 2:
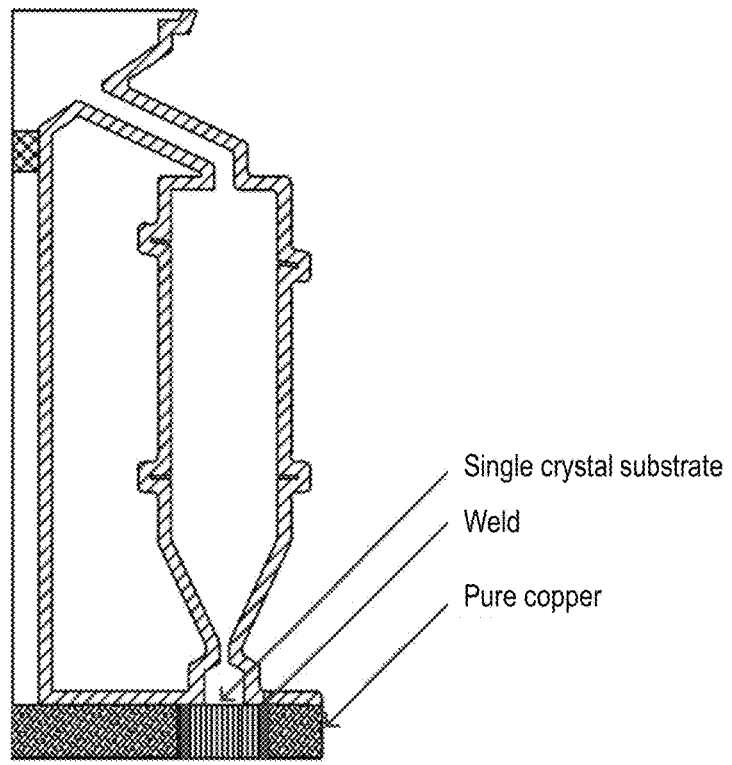
FIG. 2 is schematic diagram of the assembled single crystal substrate chilling plate.

In the present embodiment, the single crystal substrate chilling plate is assembled single crystal substrate chilling plate as shown in FIG. 2. The diameter and the height of the DD5 single crystal substrate are 20 mm and 5 mm, respectively. The DD5 single crystal substrate and pure copper are connected through tin soldering.

Figure 1:
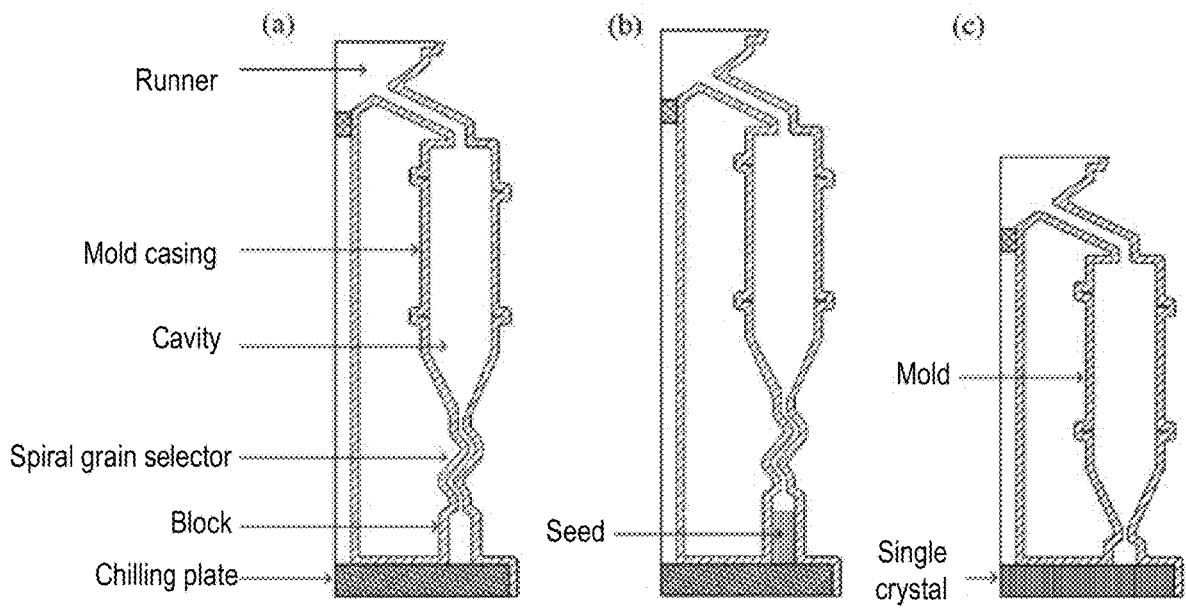
FIG. 1 are schematic diagrams of grain selection method (a), combination of seeding method and grain selector method (b), and substrate-triggered method (c) of the present invention, respectively.

(3) Melt and directional solidify the DD5 superalloy in a directional solidification furnace with obtained DD5 single crystal substrate chilling plate. The schematic diagram is shown in FIG. 1(c).

The main parameters for DD5 superalloy directional solidification are as follows: the melting temperature is 1450-1600° C. and the pouring speed of the melt molten is 5°/s; the heating temperature for the upper furnace and the lower furnace are 1500-1550° C. and 1450-1500° C., respectively; and the pulling rate during directional solidification is 20 μm/s-50 μm/s.

(4) Obtain a single crystal DD5 superalloy product by directional solidification and detect the macrostructure and microstructure.

Take out the single crystal blade with mold from the directional solidification furnace, and then knock off the mold with a hammer. Sand blast the single crystal blade for 5 min and macroscopic etching it with the etchant of $HCl+H_2O_2$ (9:1) for 1-20 min.

Figure 3:
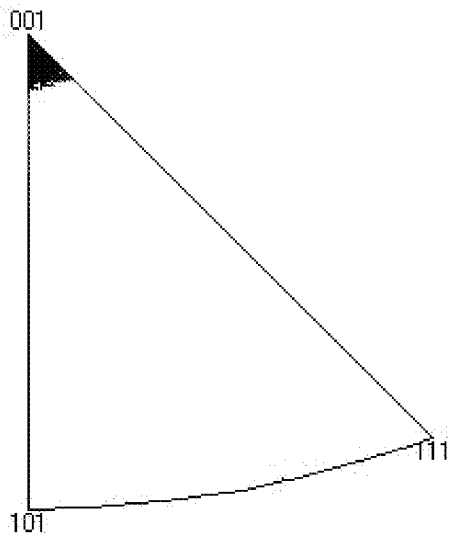
FIG. 3 is the inverse pole diagram of single crystal DD5 alloy triggered by a single crystal DD5 substrate chilling plate.
Figure 4:
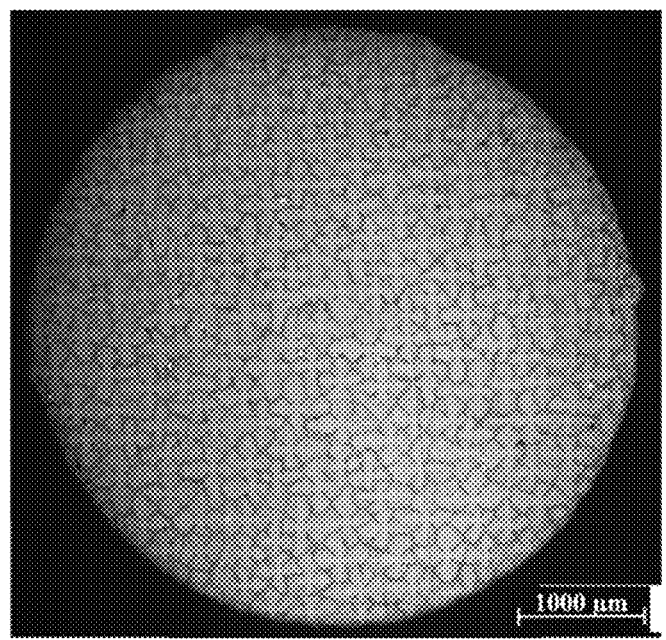
FIG. 4 is a microstructure of the single crystal DD5 alloy triggered by the single crystal DD5 substrate chilling plate.

FIG. 3 and FIG. 4 are the inverse pole diagram and the microstructure of the surface from the obtained DD5 single crystal blade which is adjacent to the single crystal substrate chilling plate respectively. It can be seen from the figures that the melt replicates the orientation of the substrate after nucleation and solidification and grows a standard (001) crystal in the substrate-triggered directional solidification.

The description described above of the embodiments is intended to make it convenient for those of ordinary skill in the art to understand and use the present invention. It will be apparent to those skilled in the art that various modifications may be readily made to these embodiments and the general principles described herein may be applied to other embodiments without making the inventive efforts. Therefore, the present invention is not limited to the embodiments described above, and improvements and modifications made by those skilled in the art in light of the present invention without departing from the scope of the present invention shall all fall within the scope of protection of the present invention.

What is claimed is:

1. A substrate-triggered single crystal superalloy directional solidification process, comprising:
   a step (1) preparing a single crystal substrate material having crystallographic characteristics that match crystallographic characteristics of the single crystal superalloy;
   a step (2) fabricating a single crystal substrate chilling plate using the obtained single crystal substrate material; and
   a step (3) applying the obtained single crystal substrate chilling plate in a directional solidification apparatus, and then preparing a single crystal alloy product by performing superalloy melting and directional solidification,
   wherein the crystallographic characteristics of the single crystal superalloy and the single crystal substrate material in the step (1) satisfy the following relation: a lattice mismatching degree between a crystal plane of the single crystal substrate material that contacts with the single crystal superalloy and a crystal plane of the single crystal superalloy is less than or equal to 7.8%,
   wherein the single crystal substrate material in the step (1) is prepared through a grain selection directional solidification process, and is detected by using the following method:
   ensuring a macrostructure of the single crystal substrate material is free of stray grains by using a sand blasting treatment and a macrostructure etching treatment;
   performing an orientation test on the single crystal substrate material in which the macrostructure is free of stray grains by using Laue Diffraction; and
   cutting the single crystal substrate material by using wire-cutting based on a test result of a Laue Diffractometer to obtain the single crystal substrate material with an expected crystal plane, and
   wherein in the step (3), a melting temperature of the superalloy is 1450° C. to 1600° C., a pouring speed of a melted superalloy is 3°/s to 10°/s, and during directional solidification, heating temperatures for an upper furnace and a lower furnace are 1500° C. to 1600° C. and 1450° C. to 1550° C., respectively, and a pulling rate is 20 μm/s to 100 μm/s.

2. The substrate-triggered single crystal superalloy directional solidification process according to claim 1, wherein a low-index crystal plane is selected as the crystal plane of the single crystal substrate material that contacts with the superalloy melt.

3. The substrate-triggered single crystal superalloy directional solidification process according to claim 1, wherein the single crystal substrate material is a single crystal bar with a cylindrical shape.

4. The substrate-triggered single crystal superalloy directional solidification process according to claim 1, wherein the single crystal substrate chilling plate in the step (2) can also be formed by using a processing of the single crystal substrate material and pure copper.

5. The substrate-triggered single crystal superalloy directional solidification process according to claim 1, wherein an inner portion of the single crystal substrate chilling plate is disposed with a water-cooling channel with a ring shape, and an outer portion of the single crystal substrate chilling plate is disposed with threads to connect with a pulling rod of the directional solidification apparatus.

6. The substrate-triggered single crystal superalloy directional solidification process according to claim 1, wherein the single crystal alloy product is subjected to macrostructure detection and microstructure detection.

7. The substrate-triggered single crystal superalloy directional solidification process according to claim 6, wherein the macrostructure detection comprises surface sand blasting and macrostructure etching, and a blasting time is 5 min to 10 min.

\* \* \* \* \*